(12) United States Patent
Xing et al.

(10) Patent No.: US 9,202,712 B2
(45) Date of Patent: Dec. 1, 2015

(54) LEAD FRAME AND A METHOD OF MANUFACTURING THEREOF

(71) Applicants: Dawei Xing, Singapore (SG); Jie Liu, Singapore (SG); Hong Wei Guan, Singapore (SG); Yue Gen Yu, Singapore (SG); Seow Kiang Khoo, Singapore (SG)

(72) Inventors: Dawei Xing, Singapore (SG); Jie Liu, Singapore (SG); Hong Wei Guan, Singapore (SG); Yue Gen Yu, Singapore (SG); Seow Kiang Khoo, Singapore (SG)

(73) Assignee: ASM TECHNOLOGY SINGAPORE PTE LTD., Singapore (SG)

( * ) Notice: Subject to any disclaimer, the term of this patent is extended or adjusted under 35 U.S.C. 154(b) by 0 days.

(21) Appl. No.: 14/158,321

(22) Filed: Jan. 17, 2014

(65) Prior Publication Data

US 2014/0203418 A1     Jul. 24, 2014

Related U.S. Application Data

(60) Provisional application No. 61/756,111, filed on Jan. 24, 2013.

(51) Int. Cl.
*H01L 21/00* (2006.01)
*H01L 21/48* (2006.01)
(Continued)

(52) U.S. Cl.
CPC ...... *H01L 21/4828* (2013.01); *H01L 23/49548* (2013.01); *H01L 23/49582* (2013.01); *H01L 23/49861* (2013.01); *H01L 24/97* (2013.01); *H01L 21/561* (2013.01); *H01L 23/3121* (2013.01); *H01L 2224/32245* (2013.01); *H01L 2224/48091* (2013.01);
(Continued)

(58) Field of Classification Search
CPC ............ H01L 23/495; H01L 23/49503; H01L 23/49575; H01L 23/49582; H01L 21/4828; H01L 2224/73265; H01L 2224/48247; H01L 2224/48257; H01L 23/49548; H01L 23/49861
USPC .......... 438/111, 112, 123, 124; 257/666, 676, 257/E23.031, E21.502, E23.052, E23.037
See application file for complete search history.

(56) References Cited

U.S. PATENT DOCUMENTS

| | | | |
|---|---|---|---|
| 2008/0061414 A1* | 3/2008 | Retuta et al. | 257/676 |
| 2009/0032943 A1* | 2/2009 | Shoji et al. | 257/737 |

(Continued)

*Primary Examiner* — Khiem D Nguyen
(74) *Attorney, Agent, or Firm* — Ostrolenk Faber LLP

(57) ABSTRACT

A method of manufacturing a lead frame, comprising the steps of: providing an electrically-conductive base material having first and second planar sides; forming a patterned conductive layer on the first planar side of the base material; etching the second planar side of the base material at portions with respect to exposed portions on the first planar side of the base material comprising the patterned conductive layer, to form partially-etched portions on the second planar side of the base material; providing a non-conductive filling material over the second planar side of the base material, wherein the filling material fills spaces inside the partially-etched portions on the second planar side of the base material to form adjacent portions of the filling material and a plurality of conductive portions on the second planar side of the base material; and etching the exposed portions of the first planar side of the base material comprising the patterned conductive layer to form partially-etched portions on the first planar side of the base material that combine with the partially-etched portions on the second planar side of the base material to thereby form a plurality of separate conductive regions on the first planar side of the base material, each conductive region being electrically conductive with at least a respective one of the plurality of conductive portions on the second planar side of the base material.

10 Claims, 7 Drawing Sheets

(51) Int. Cl.
*H01L 23/495* (2006.01)
*H01L 23/498* (2006.01)
*H01L 23/00* (2006.01)
*H01L 23/31* (2006.01)
*H01L 21/56* (2006.01)

(52) U.S. Cl.
CPC ............... *H01L 2224/48247* (2013.01); *H01L 2224/73265* (2013.01); *H01L 2224/97* (2013.01)

(56) References Cited

U.S. PATENT DOCUMENTS

| | | | |
|---|---|---|---|
| 2009/0283884 A1* | 11/2009 | Kang et al. | 257/676 |
| 2011/0267789 A1 | 11/2011 | Chew et al. | |
| 2012/0104588 A1* | 5/2012 | Chen et al. | 257/676 |
| 2012/0241962 A1* | 9/2012 | Camacho | 257/768 |
| 2013/0154072 A1* | 6/2013 | Do et al. | 257/676 |

* cited by examiner

LEAD FRAME AND A METHOD OF MANUFACTURING THEREOF

TECHNICAL FIELD OF THE INVENTION

This invention relates to a lead frame and a method of fabricating the lead frame that is particularly, but not exclusively, for supporting semiconductor dies during semiconductor packaging.

BACKGROUND OF THE INVENTION

Lead frames are typically used during semiconductor packaging to serve as an electrical interconnect between semiconductor dies of semiconductor packages and external circuitries. Lead frames are also commonly used in the fabrication of semiconductor packages because they provide an efficient form of heat dissipation. Semiconductor packaging first involves dicing a semiconductor wafer to separate semiconductor dies on the semiconductor wafer. After dicing of the semiconductor wafer has been completed, the semiconductor dies are then individually attached to respective die pads of the lead frame via die bonding, and thereafter, electrical connections are formed between each semiconductor die and the respective leads of the lead frame via wire bonding using fine wires. Subsequently, the lead frame is encased within a mold to encapsulate each of the semiconductor dies with an encapsulant (e.g. epoxy resin) by injection molding or compression molding.

With the dual impact of increasing miniaturisation and processing capability among modern day electronic packages, there is now an ever-greater demand for semiconductor packaging processes and/or tools to achieve a higher density of electrical connections between semiconductor dies and lead frames compared with conventional methods and devices, in order to reduce the form factor or size of electronic packages. This has resulted in the introduction of new semiconductor package structures and methods of fabrication thereof in the back-end semiconductor industry.

For instance, US 2011/0267789 proposes a semiconductor package structure and a method of fabrication thereof, which is illustrated in FIGS. 1a to 1d. FIG. 1a shows a first metal layer 120 and a second metal layer 130 that are formed on a conductive carrier 110 by electrolytic plating. Specifically, it can be seen from FIG. 1a that the first metal layer 120 forms a plurality of lead pads 121 and a die-attach pad 122, while the second metal layer 130 forms a plurality of bond pads 131 and die-attach barriers 132. FIG. 1b shows that whilst the first and second metal layers 120, 130 are being supported on the conductive carrier 110, a semiconductor die 160 is bonded to the die-attach pad 122 and electrical interconnections are formed between the semiconductor die 160 and the bond pads 131. The first and second metal layers 120, 130 and the semiconductor die 160 are then encapsulated by an encapsulation layer 170 as shown in FIG. 1c, and the conductive carrier 110 is thereafter removed from the semiconductor package structure as shown in FIG. 1d.

By providing the conductive carrier 110 to support the first and second metal layers 120, 130, the separation between the bond pads 131 and the die-attach barriers 132 may be reduced to increase the density of electrical interconnections between the semiconductor die 160 and the bond pads 131. However, one limitation of the approach used in US 2011/0267789 is the need to remove the conductive carrier 110 by chemical etching after the encapsulation layer 170 has been formed. Accordingly, the step of removing the conductive carrier 110 presents an additional process in the fabrication that may increase the complexity and costs of fabricating the semiconductor package structure.

Thus, it is an object of the present invention to seek to propose a lead frame as well as a method of fabrication thereof that at least ameliorates the limitation of US 2011/0267789 as described, and to provide the general public with a useful choice.

SUMMARY OF THE INVENTION

A first aspect of the invention is a method of manufacturing a lead frame, the method comprising the steps of: providing an electrically-conductive base material having first and second planar sides; forming a patterned conductive layer on the first planar side of the base material; etching the second planar side of the base material at portions with respect to exposed portions on the first planar side of the base material comprising the patterned conductive layer, to form partially-etched portions on the second planar side of the base material; providing a non-conductive filling material over the second planar side of the base material, wherein the filling material fills spaces inside the partially-etched portions on the second planar side of the base material to form adjacent portions of the filling material and a plurality of conductive portions on the second planar side of the base material; and etching the exposed portions of the first planar side of the base material comprising the patterned conductive layer to form partially-etched portions on the first planar side of the base material that combine with the partially-etched portions on the second planar side of the base material to thereby form a plurality of separate conductive regions on the first planar side of the base material, each conductive region being electrically conductive with at least a respective one of the plurality of conductive portions on the second planar side of the base material.

In this way, the patterned conductive layer on the first planar side of the base material could serve as a mask for the later step of etching the exposed portions of the first planar side of the base material to form the partially-etched portions thereon, and therefore, a separate photoresist mask would not be required.

Some preferred but optional features/steps of the invention according to its first aspect are defined in the dependent claims. For example, the invention may include the further step of plating the conductive portions on the second planar side of the base material. In particular, such a step may be performed after the filling material is filled inside the partially-etched portions on the second planar side of the base material. In this way, the filling material inside the partially-etched portions serves as a mask for plating the conductive portions on the second planar side of the base material and, therefore, the use of a separate photoresist mask would not be required.

A second aspect of the invention is a semiconductor package fabricated using a lead frame manufactured as defined above.

BRIEF DESCRIPTION OF THE DRAWINGS

Preferred embodiments of the invention will be described, with reference to the accompanying drawings, of which:

FIG. 2a shows a planar side of the lead frame onto which a semiconductor die is bonded according to a preferred embodiment of the invention, while

DETAILED DESCRIPTION OF THE PREFERRED EMBODIMENTS

Figure 1A:
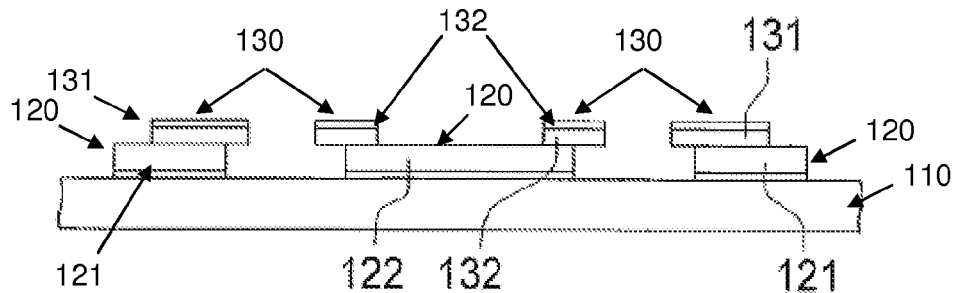
FIGS. 1a to 1d show the steps of a known method of fabricating a semiconductor package structure.
Figure 1B:
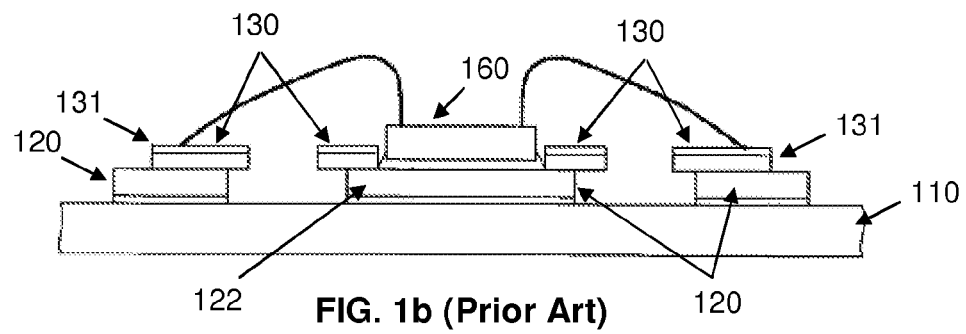
Figure 1C:
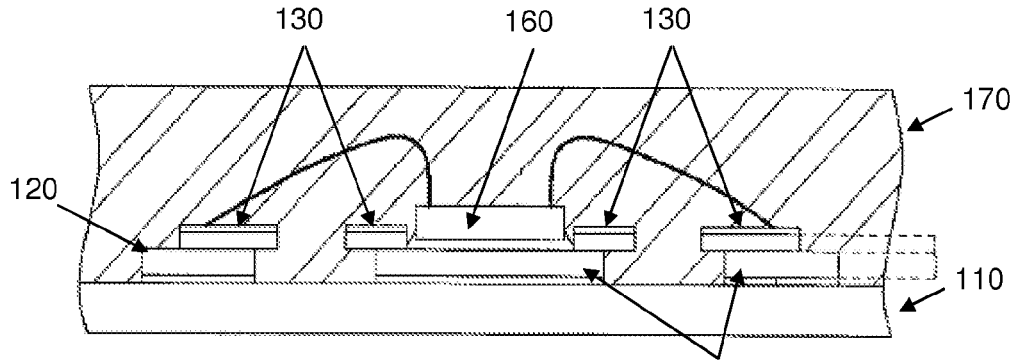
Figure 1D:
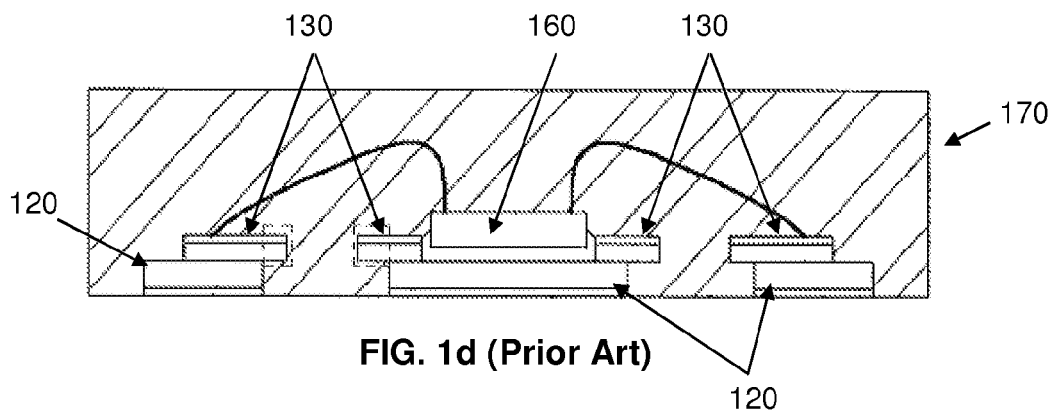
Figure 2A:
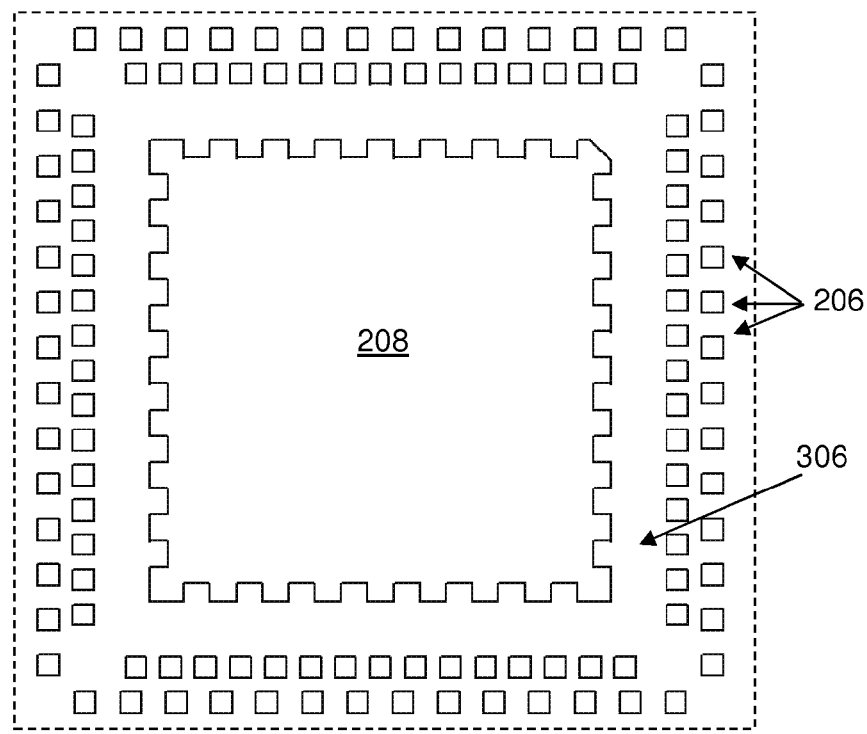
Figure 2B:
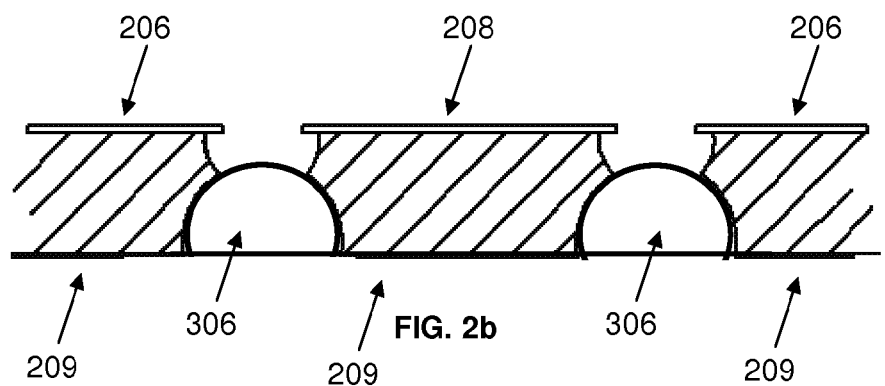
FIG. 2b shows a cross-sectional view of the lead frame.

FIG. 2a shows a region on a planar side of a lead frame onto which semiconductor dies are bonded according to a preferred embodiment of the invention, whereas FIG. 2b shows a cross-sectional view of the region on the lead frame.

In particular, the region on the planar side of the lead frame as shown in FIG. 2a defines leads 206 and a die-attach pad 208. The leads 206 are arranged in inner and outer rings to increase the density of electrical interconnections within the lead frame, and are electrically insulated from the die-attach pad 208 via a non-conductive filling compound 306 to form a plurality of separate conductive regions on the planar side of the lead frame. After a semiconductor die is bonded to the die-attach pad 208, bonding wires are used to form electrical interconnections between the semiconductor die and the leads 206 of the die-attach region 204. It can be seen from the leads 206 of the die-attach region 204 includes a fine pitch configuration, wherein the pitch distance between adjacent leads 206 measures about 90 microns. The conductive regions are operative to electrically connect the semiconductor die to corresponding conductive pads on a printed circuit board (PCB).

FIG. 2b shows a cross-sectional view of the region of the lead frame. It can be seen that the plurality of conductive regions comprising the leads 206 and the die-attach pad 208 each has a larger surface area than its corresponding conductive contact 209 on an opposite planar side of the lead frame. Such a configuration provides strong mechanical interlocking which improves the pull strength of the leads 206 and the die-attach pad 208, and properly secures the leads 206 and the die-attach pad 208 inside an encapsulation mold when the final semiconductor package has been formed.

Advantageously, the overall package reliability of a final semiconductor package can be improved.

FIGS. 3a-3e show the steps of fabricating the lead frame according to a first embodiment of the invention.

Figure 3A:
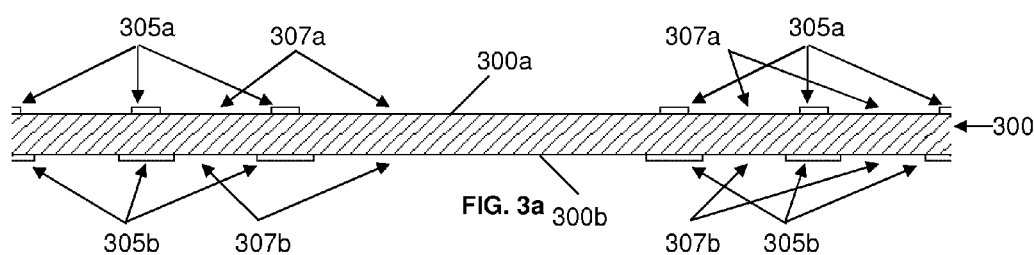
FIGS. 3a-3e show the steps of fabricating the lead frame of FIGS. 2a and 2b according to a first embodiment of the invention.

First, an electrically-conductive base material 300 having first and second planar sides 300a, 300b is provided as shown in FIG. 3a. The conductive base material 300 is a copper alloy having a thickness of about 4 to 20 mils (i.e. about 0.1 mm to 0.5 mm). It should, however, be appreciated that the base material 300 may also comprise other types of metallic alloy so long as they are electrically conductive.

Next, photoresist layers 305a, 305b are coated on the first and second planar sides 300a, 300b respectively. Specifically, the photoresist layers 305a, 305b comprise openings 307a, 307b on the first and second planar sides 300a, 300b of the base material 300 at positions corresponding to the patterned conductive layer 204 and the conductive contacts 209 of the lead frame respectively. Each of the photoresist layers 305a, 305b may be formed by first coating uniform photoresist layers on the first and second planar sides 300a, 300b by lamination, screen-printing or spin-coating. Thereafter, required images corresponding to the patterned conductive layer 204 and the conductive contacts 209 are imprinted on the uniform photoresist layers using UV radiation, so as to remove portions of the uniform photoresist layers corresponding to the patterned conductive layer 204 and the conductive contacts 209 to form suitable photoresist masks.

Figure 3B:
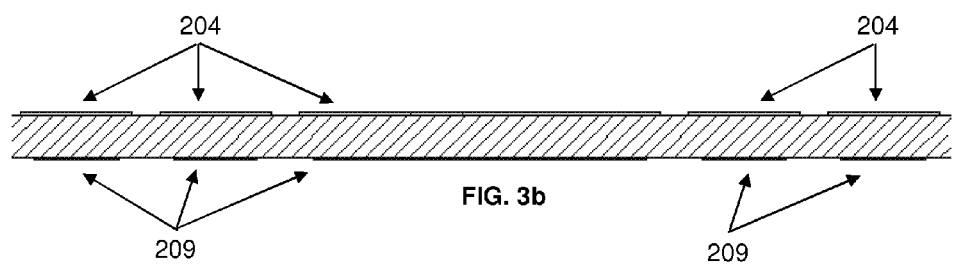

Through electrolytic plating, the patterned conductive layer 204 and the conductive contacts 209 are thereby formed in the openings 307a, 307b of the photoresist layers 305a, 305b on the first and second planar side 300a, 300b of the conductive base material 300, as shown in FIG. 3b. The photoresist layers 305a, 305b are then removed from the base material 300. Removal of the photoresist layers 305a, 305b may be accomplished by way of aqueous dissolution in an alkaline solution. The patterned conductive layer 204 and the conductive contacts may comprise any conductive material that is suitable for wire bonding and soldering. Examples of suitable conductive materials include Silver (Ag), Nickel-Palladium-Gold (Ni—Pd—Au) alloy, and Nickel-Silver alloy (Ni—Ag).

It should be noted that besides electrolytic plating, the patterned conductive layer 204 and the conductive contacts 209 may also be formed by printing a conductive material, such as copper paste or copper ink, directly on the desired portions of the first and second planar sides 300a, 300b of the base material 300, followed by a curing or sintering process to allow the conductive material to solidify.

Figure 3C:
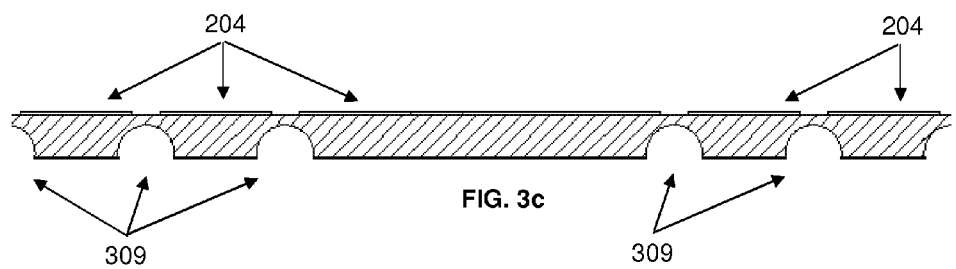

Subsequently, the exposed portions of the second planar side 300b of the base material 300 comprising the conductive contacts 209 are etched through using an etching solution, such as cupric chloride, ferric chloride, or an ammonia-based alkaline, to form partially-etched portions 309 on the second planar side 300b of the base material 300, as shown in FIG. 3c. It should be noted that the exposed portions of the second planar side 300b of the base material 300 also correspond to the exposed portions of the first planar side 300b of the base material 300 comprising the patterned conductive layer 204.

Specifically, the etching depth of the second planar side 300b of the base material 300 is controlled at more than 60% of the base material thickness to form the partially-etched portions 309 which are generally dome-shaped. Such an etched depth of the partially-etched portions 309 enhances structural support of the base material 300 because a sufficiently large volume of the non-conductive filling compound 306 can be filled therein. Likewise, the dome-shaped of the partially-etched portions 309 also enhances structural support of the base material 300 when the conductive filling compound 307 is introduced therein.

Figure 3D:
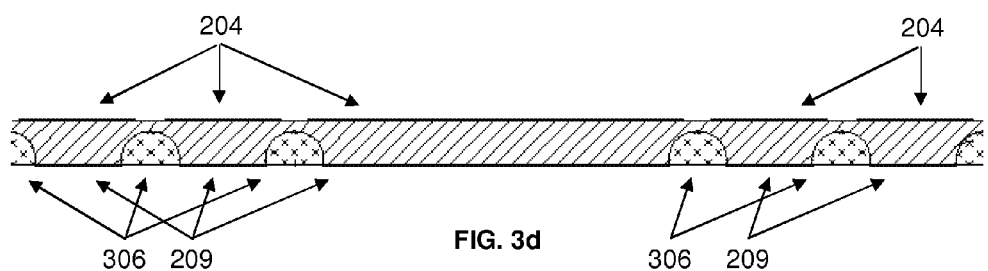

Thereafter, the non-conductive filling compound 306 is provided over the second planar side 300b of the base material 300 such that the filling compound 306 fills the spaces inside the partially-etched portions 309 to form adjacent portions of the filling material 306 and the conductive contacts 209 on the second planar side 300b of the base material 300, as shown in FIG. 3d. For compatibility with downstream processes, the filling compound 306 is preferably a thermoset type of plastic molding compound that is commonly used in the semiconductor packaging industry. However, the filling compound 306 may comprise any material (e.g. an epoxy molding compound) so long as it is not electrically conductive.

The step of providing the filling compound 306 over the second planar side 300b of the base material 300 may involve allowing the filling compound 306 to overflow from the partially-etched portions 309, whereby a thickness of the filling compound 306 that overflows from the partially-etched portions 309 is about 4 mils (about 0.1 mm). However, it should be appreciated that the filling compound 306 may also overflow from the partially-etched portions 309 by any predetermined thickness. Deflashing of the filling compound 306 by either chemical deflashing or mechanical deflashing (e.g. grinding) is then carried out to remove the excess filling compound 306, such that the conductive contacts 209 are exposed from the second planar side 300b of the base material 300 as shown in FIG. 3d.

Figure 3E:
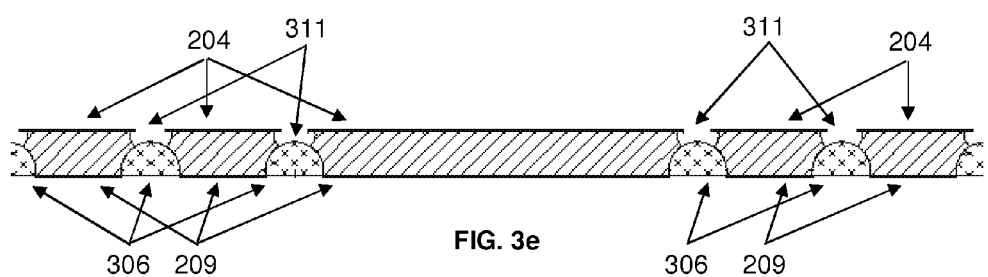

Subsequently, the exposed portions of the first planar side 300a of the base material 300 comprising the patterned conductive layer 204 are etched through using an etching solution, such as cupric chloride, ferric chloride, or an ammonia-based alkaline, to form partially-etched portions 311 that are generally dome-shaped on the first planar side 300a of the base material 300, as shown in FIG. 3e. In particular, the partially-etched portions 311 on the first planar side 300a of the base material 300 combine with the respective partially-etched portions 309 on the second planar side 300b of the base material 300, to form a plurality of separate conductive regions on the first planar side 300a of the base material 300 which define the leads 206 and the die-attach pads 208. Specifically, each conductive region is electrically conductive with at least a respective one of the conductive contacts 209 on the second planar side 300b of the base material 300. Thereafter the fabrication of the lead frame is completed.

It should be noted that the patterned conductive layer 204 on the first planar side 300a of the base material 300 serves as a mask for etching the exposed portions of the first planar side 300a of the base material 300 to form the partially-etched portions 309 thereon, and therefore, a separate photoresist mask would not be required. FIGS. 4a-4f show the steps of fabricating the lead frame according to a second embodiment of the invention.

Like the fabrication of the lead frame according to the first embodiment of the invention, the electrically-conductive base material 300 having the first and second planar sides 300a, 300b is first provided, before the photoresist layers 305a, 305c are coated on the first and second planar sides 300a, 300b of the base material 300 respectively.

In contrast to the method of fabricating the lead frame according to the first embodiment of the invention, however, a masking layer 401 is provided over the second planar side 300b of the base material 300 for protection (see FIG. 4b), before the patterned conductive layer 204 is formed on the first planar side 300a of the base material 300. The masking material 401 may be a tape or any other suitable non-conductive protective material. By providing the masking layer 401 over the second planar 300b of the base material 300, only the patterned conductive layer 204 is formed on the first planar side 300a of the base material 300. The conductive contacts 209 are, however, not formed on the second planar side 300b of the base material 300.

Figure 4A:
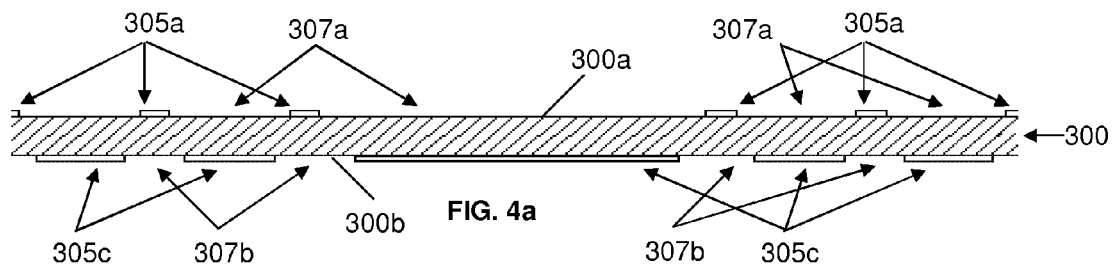
FIGS. 4a-4f show the steps of fabricating the lead frame of FIGS. 2a and 2b according to a second embodiment of the invention.
Figure 4B:
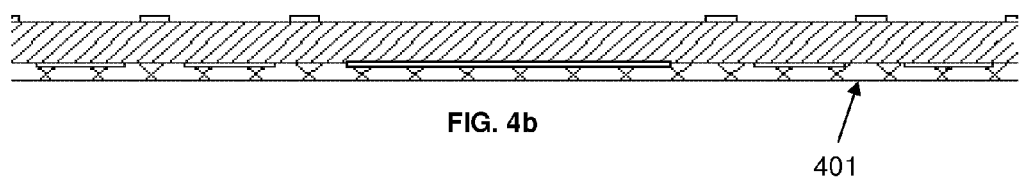
Figure 4C:
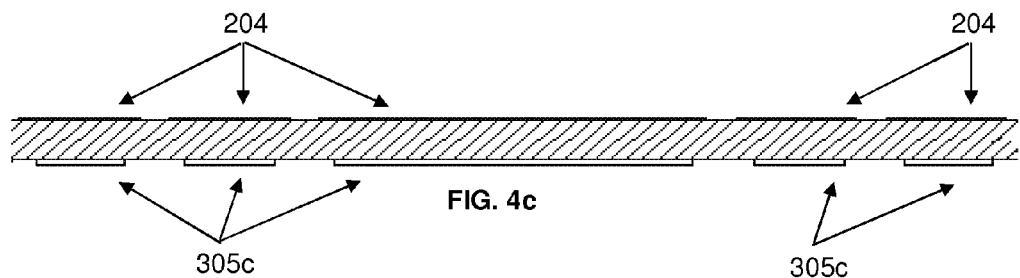
Figure 4D:
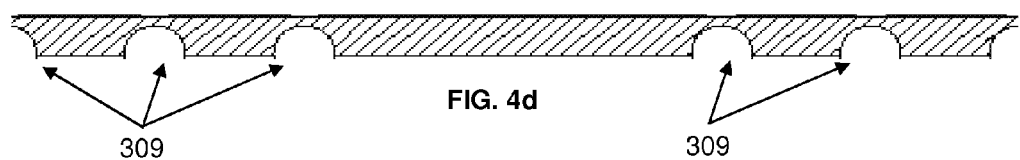

After the patterned conductive layer 204 has been formed on the first planar side 300a of the base material 300, the masking layer 401 is then removed (see FIG. 4c). Subsequently, the exposed portions of the second planar side 300b of the base material 300 comprising the photoresist layer 305c are etched through to form the partially-etched portions 309 before the photoresist layer 305c on the second planar side 300b of the base material 300 is removed (see FIG. 4d).

Figure 4E:
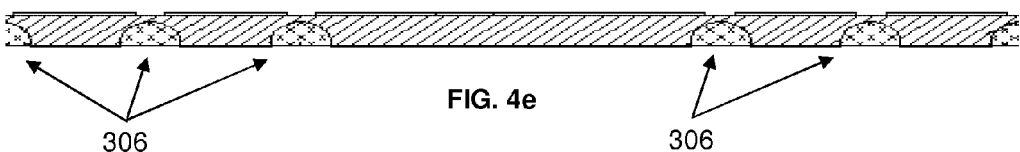
Figure 4F:
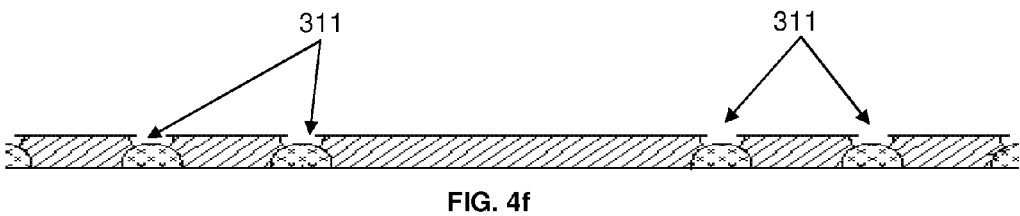

Thereafter, the non-conductive filling compound 306 is provided over the second planar side 300b of the base material 300 such that the filling compound 306 fills the spaces inside the partially-etched portions 309 (see FIG. 4e). Subsequently, the exposed portions of the first planar side 300a of the base material 300 comprising the patterned conductive layer 204 are etched through to form the partially-etched portions 311 on the first planar side 300a of the base material 300 (see FIG. 4f). Similarly, the partially-etched portions 311 on the first planar side 300a of the base material 300 combine with the respective partially-etched portions 309 on the second planar side 300b of the base material 300, to form a plurality of separate conductive regions on the first planar side 300a of the base material 300 which define the leads 206 and the die-attach pads 208. Specifically, each conductive region is electrically conductive with at least a respective one of the conductive contacts 209 on the second planar side 300b of the base material 300. Finally, the second planar side 300a of the base material 300 is plated (not shown) to form the conductive contacts 209 and the fabrication of the lead frame is completed. In particular, the filling material inside the partially-etched portions 309 on the second planar side 300b of the base material 300 serves as a mask for plating the conductive portions 209 on the second planar side of the base material 300, and therefore, a separate photoresist mask would not be required.

It should be appreciated that the filling material 306 on the second planar side 300b of the base material 300 can act as a photoresist layer for plating the second planar side 300a of the base material 300 to form the conductive contacts 209. It should also be appreciated that similar processes of the first embodiment of the invention as described above also apply to the second embodiment of the invention.

FIGS. 5a-5e show the steps of fabricating the lead frame according to a third embodiment of the invention.

Figure 5A:
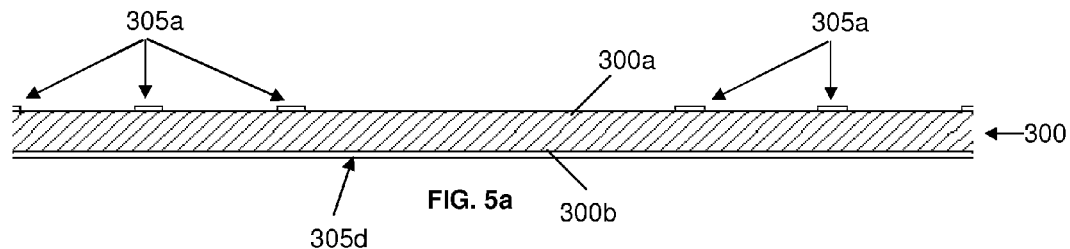
FIGS. 5a-5e show the steps of fabricating the lead frame of FIGS. 2a and 2b according to a third embodiment of the invention.

Similarly, the electrically-conductive base material 300 having the first and second planar sides 300a, 300b is first provided, before the photoresist layers 305a, 305d are coated on the first and second planar sides 300a, 300b of the base material 300 respectively (see FIG. 5a).

In contrast to the method of fabricating the lead frame according to the first and second embodiments of the invention, however, the photoresist layer 305d on the second planar side 300b of the base material 300 is a uniform layer of photoresist layer.

Figure 5B:
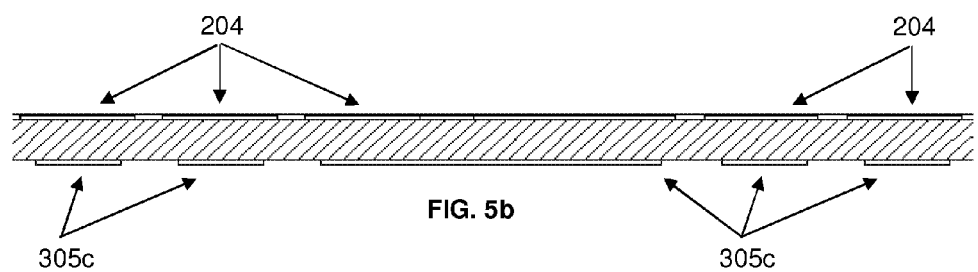
Figure 5C:
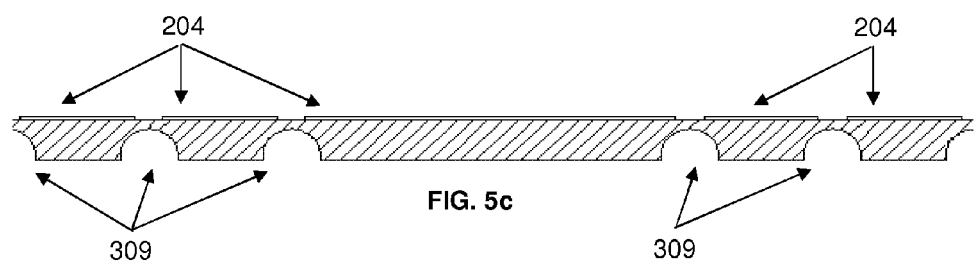

After the patterned conductive layer 204 has been formed on the first planar side 300a of the base material 300, the photoresist layer 305c on the second planar side 300b of the base material 300 is subject to UV radiation to form the photoresist layer 305c (see FIG. 5b). Subsequently, the exposed portions of the second planar side 300b of the base material 300 comprising the photoresist layer 305c are etched through to form the partially-etched portions 309 before the photoresist layer 305c on the second planar side 300b of the base material 300 is removed (see FIG. 5c).

Figure 5D:
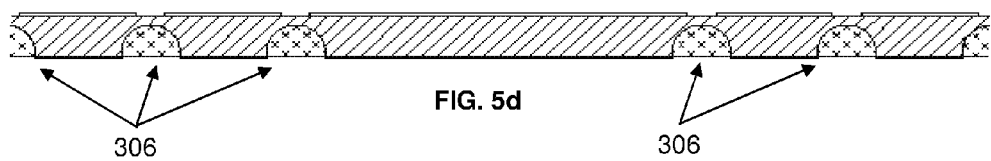
Figure 5E:
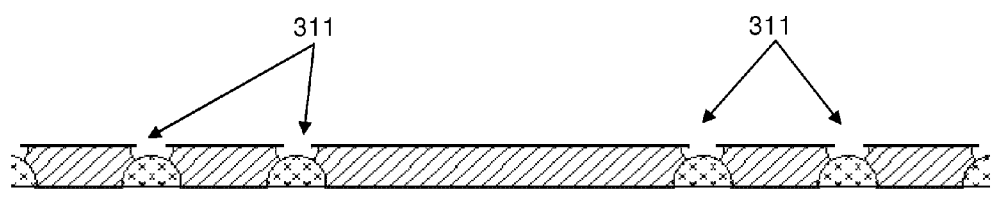

Thereafter, the non-conductive filling compound 306 is provided over the second planar side 300b of the base material 300 such that the filling compound 306 fills the spaces inside the partially-etched portions 309 (see FIG. 5d). Subsequently, the exposed portions of the first planar side 300a of the base material 300 comprising the patterned conductive layer 204 are etched through to form the partially-etched portions 311 on the first planar side 300a of the base material 300 (see FIG. 5e). Similarly, the partially-etched portions 311 on the first planar side 300a of the base material 300 combine with the respective partially-etched portions 309 on the second planar side 300b of the base material 300, to form a plurality of separate conductive regions on the first planar side 300a of the base material 300 which define the leads 206 and the die-attach pads 208. Specifically, each conductive region is electrically conductive with at least a respective one of the conductive contacts 209 on the second planar side 300b of the base material 300. Finally, the second planar side 300a of the base material 300 is plated (not shown) to form the conductive contacts 209 and the fabrication of the lead frame is completed. Again, it should be appreciated that the filling material 306 on the second planar side 300b of the base material 300 can act as a photoresist layer for plating the second planar side 300a of the base material 300 to form the conductive contacts 209. It should also be appreciated that similar processes of the first embodiment of the invention as described above also apply to the third embodiment of the invention.

Figure 6A:
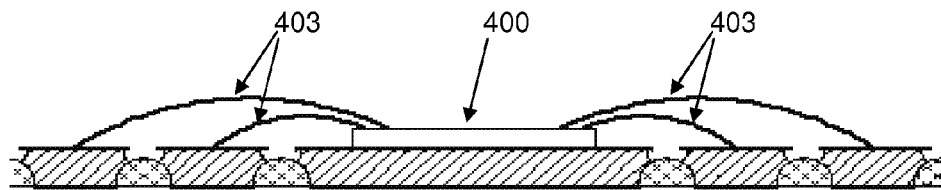
FIGS. 6a-6c show the steps of fabricating a final semiconductor package structure using the lead frame of FIGS. 2a and 2b.
Figure 6B:
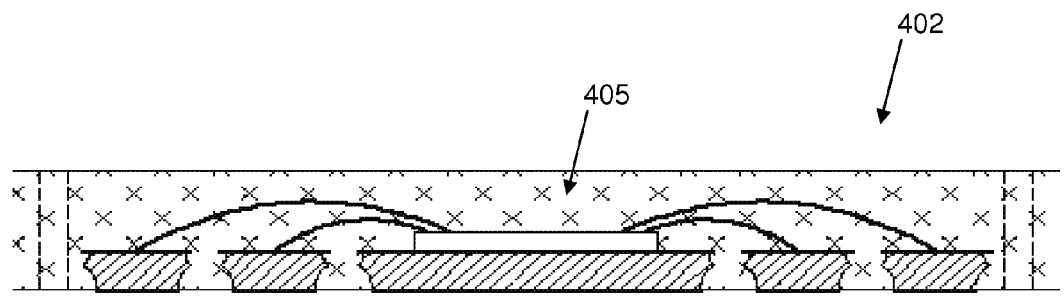
Figure 6C:
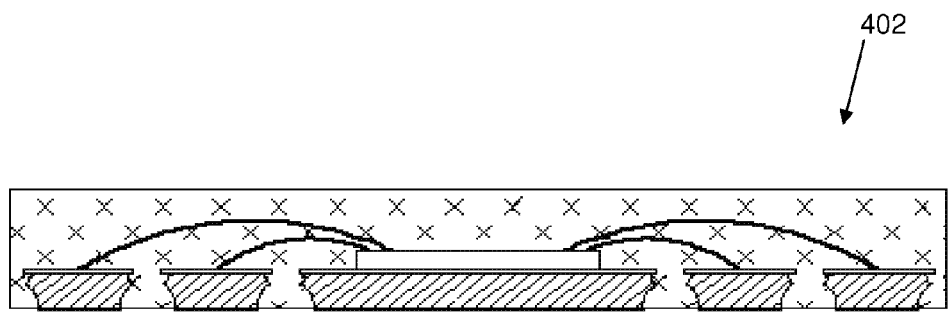

FIGS. 6a-6c show the steps of fabricating the final semiconductor package structure using the lead frame. Specifically, FIG. 4a shows a semiconductor die 400 attached to the die-attach pad 208 via die bonding. Electrical connections are also formed between the semiconductor die 400 and the respective leads 206 of the lead frame via wire bonding using bonding wires 403. FIG. 6b shows the semiconductor die 400 being encapsulated by an encapsulant 405 (e.g. an epoxy molding compound), preferably by injection molding or compression molding, to form a final semiconductor package structure 402. Finally, FIG. 6c shows the final semiconductor package structure 402 being separated from the lead frame, preferably by a singulation process.

Having fully described the invention, it should be apparent to one of ordinary skill in the art that many modifications can be made without departing from the scope as claimed. For instance, it should be appreciated that the lead frame comprises regions onto which semiconductor dies are respectively bonded thereto. These regions may be in arranged in multiple arrays, each array comprising multiple rows and columns of individual regions onto which individual semiconductor dies (not shown) are bonded thereto.

The invention claimed is:

1. A method of manufacturing a lead frame, the method comprising the steps of:
providing an electrically-conductive base material having first and second planar sides;
forming a patterned conductive layer on the first planar side of the base material;
etching the second planar side of the base material at portions with respect to exposed portions on the first planar side of the base material comprising the patterned conductive layer, to form partially-etched portions on the second planar side of the base material;
providing a non-conductive filling material over the second planar side of the base material, wherein the filling material fills spaces inside the partially-etched portions on the second planar side of the base material to form adjacent portions of the filling material and a plurality of conductive portions on the second planar side of the base material;
after the step of providing a non-conductive filing material over the second planar side of the base material, etching the exposed portions of the first planar side of the base material comprising the patterned conductive layer to form partially-etched portions on the first planar side of the base material that combine with the partially-etched portions on the second planar side of the base material to thereby form a plurality of separate conductive regions on the first planar side of the base material, each conductive region being electrically conductive with at least a respective one of the plurality of conductive portions on the second planar side of the base material, and wherein the step of etching the second planar side of the base material comprises etching a depth which is more than 60% of the thickness of the base material to form the partially-etched portions on the second planar side of the base material;
after the etching of the exposed portions of the first planar side, plating the plurality of conductive portions on the second planar side of the base material.

2. A method of manufacturing a lead frame, the method comprising the steps of:
providing an electrically-conductive base material having first and second planar sides;
forming a patterned conductive layer on the first planar side of the base material;
etching the second planar side of the base material at portions with respect to exposed portions on the first planar side of the base material comprising the patterned conductive layer, to form partially-etched portions on the second planar side of the base material;
providing a non-conductive filling material over the second planar side of the base material, wherein the filling material fills spaces inside the partially-etched portions on the second planar side of the base material to form adjacent portions of the filling material and a plurality of conductive portions on the second planar side of the base material; and
after the step of providing a non-conductive filing material over the second planar side of the base material, etching the exposed portions of the first planar side of the base material comprising the patterned conductive layer to form partially-etched portions on the first planar side of the base material that combine with the partially-etched portions on the second planar side of the base material to thereby form a plurality of separate conductive regions on the first planar side of the base material, each conductive region being electrically conductive with at least a respective one of the plurality of conductive portions on the second planar side of the base material;
wherein the step of etching the second planar side of the base material comprises etching a depth which is more than 60% of the thickness of the base material to form the partially-etched portions on the second planar side of the base material.

3. The method of claim 2, wherein the step of forming the patterned conductive layer on the first planar side of the base material involves the use of a photoresist mask.

4. The method of claim 2, wherein the step of forming the patterned conductive layer on the first planar side of the base material involves electrolytic plating.

5. The method of claim 2, wherein the plurality of conductive regions on the first planar side of the base material have a larger surface area than the plurality of conductive portions on the second planar side of the base material.

6. The method of claim 5, wherein the steps of etching the first and second planar sides of the base material include forming the partially-etched portions on the first and second planar sides of the base material which are generally dome-shaped.

7. The method of claim 2, further comprising the step of plating the plurality of conductive portions on the second planar side of the base material.

8. The method of claim 7, wherein the step of plating the plurality of conductive portions on the second planar side of the base material, is performed after the step of etching the exposed portions of the first planar side of the base material.

9. The method of claim 7, wherein the step of plating the plurality of conductive portions on the second planar side of the base material is performed after the step of filling the filling material inside the partially-etched portions on the second planar side of the base material, so that the filling material inside the partially-etched portions serves as a mask for plating the conductive portions on the second planar side of the base material.

10. The method of claim 7, wherein the step of plating the conductive portions on the second planar side of the base material is performed before the step of etching the second planar side of the base material to form the partially-etched portions on the second planar side of the base material.

* * * * *